United States Patent
Honda et al.

(10) Patent No.: US 8,173,036 B2
(45) Date of Patent: May 8, 2012

(54) PLASMA PROCESSING METHOD AND APPARATUS

(75) Inventors: Masanobu Honda, Nirasaki (JP); Tetsuji Sato, Nirasaki (JP); Shin Matsuura, Nirasaki (JP); Yutaka Matsui, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 844 days.

(21) Appl. No.: 11/365,676

(22) Filed: Mar. 2, 2006

(65) Prior Publication Data
US 2006/0196847 A1    Sep. 7, 2006

Related U.S. Application Data

(60) Provisional application No. 60/662,778, filed on Mar. 18, 2005.

(30) Foreign Application Priority Data

Mar. 2, 2005    (JP) ................................. 2005-057923

(51) Int. Cl.
  C23F 1/00    (2006.01)
  H01L 21/306  (2006.01)
(52) U.S. Cl. ................................. 216/67; 134/1; 134/11
(58) Field of Classification Search .................... 216/67; 134/1, 1.2, 1.3, 11, 22.1
See application file for complete search history.

(56) References Cited

U.S. PATENT DOCUMENTS

| | | | | |
|---|---|---|---|---|
| 5,679,214 A | * | 10/1997 | Kuo ................................. | 134/1.1 |
| 6,450,117 B1 | * | 9/2002 | Murugesh et al. ..... | 118/723 ME |
| 2003/0129840 A1 | * | 7/2003 | Kumar et al. ................. | 438/694 |
| 2004/0084422 A1 | * | 5/2004 | Beckmann et al. ...... | 219/121.33 |
| 2004/0261815 A1 | * | 12/2004 | Pavone .......................... | 134/1.3 |
| 2005/0079706 A1 | * | 4/2005 | Kumar et al. ................. | 438/638 |
| 2005/0133923 A1 | * | 6/2005 | Yoshie .......................... | 257/758 |
| 2007/0181145 A1 | * | 8/2007 | Ishizuka et al. ................ | 134/1.1 |

OTHER PUBLICATIONS

Delfino et al. (Journal of Applied Physics, vol. 71 (2), pp. 1001-1009, Jan. 15, 1992).*

* cited by examiner

*Primary Examiner* — Nadine G Norton
*Assistant Examiner* — Mahmoud Dahimene
(74) *Attorney, Agent, or Firm* — Oblon, Spivak, McClelland, Maier & Neustadt, L.L.P.

(57) ABSTRACT

A plasma processing method includes the steps of etching the target object with a CF-based processing gas by using a patterned resist film as a mask, removing deposits accumulated inside a processing chamber during the step of etching the target object by using a processing gas containing at least an $O_2$ gas, and ashing the resist film by using a processing gas containing at least an $O_2$ gas. Relevant places in the processing chamber from which the deposits are removed are heated in the step of removing the deposits.

12 Claims, 4 Drawing Sheets

PLASMA PROCESSING METHOD AND APPARATUS

FIELD OF THE INVENTION

The present invention relates to a plasma processing method and apparatus for plasma-processing a target object accommodated in a processing chamber.

BACKGROUND OF THE INVENTION

Generally, in a semiconductor manufacturing process, a desired pattern is etched by using a resist film as a mask formed on a surface of a target object such as a semiconductor wafer (hereinafter referred to as a [wafer]), and then, removing the resist film from the surface of the wafer. Conventionally, the resist film is removed by employing an ashing method, the method including a simultaneous heating of the wafer in a processing chamber and a removal of the resist film using active species such as O radicals generated during a conversion of $O_2$ (oxygen) gas introduced into the processing chamber into a plasma (a plasma ashing method). As mentioned, by performing the etching process and the ashing process successively in the same processing chamber, the time required to transfer the target object to another processing chamber can be saved, thereby reducing the overall processing time.

However, if the etching process is performed by using, for example, a fluorine containing processing gas, CF polymers (a fluorocarbon-based polymer) may become deposited on an inner wall of the processing chamber. If the ashing process is continued in such a state, the CF polymers deposited on an inner peripheral surface of the processing chamber may redissociate, and an etching stop layer or an insulating film on the wafer may be damaged by F (fluorine).

Therefore, in order to prevent the damages caused by F, a method of carrying out the ashing process in two steps has been conventionally employed. As the first step, the plasma is generated in the processing chamber without applying a bias voltage to the wafer, which will, in turn, remove the CF polymers deposited on the inner peripheral surface and the like of the processing chamber. As the second step, the bias voltage is applied to the wafer, and the resist film on the wafer is removed. Such a process of removing the resist film in two steps is referred to as a ∉Hybrid-Ashing⌋. The hybrid-ashing is disclosed in the following Patent Documents 1 to 6:

Patent Document 1: Japanese Patent Laid-open Application No. H11-145111;
Patent Document 2: Japanese Patent Laid-open Application No. 2000-183040;
Patent Document 3: Japanese Patent Laid-open Application No. H6-45292;
Patent Document 4: Japanese Patent Laid-open Application No. H10-209118;
Patent Document 5: Japanese Patent Laid-open Application No. 2001-176859; and
Patent Document 6: Japanese Patent Laid-open Application No. 2003-264170.

However, in the above described hybrid-ashing, the process on the wafer is stopped while the process of removing the CF polymers is performed in the first step, and thus, the overall processing time may be increased. To shorten the processing time, it is preferable that a time required for the first step performing the removal of the CF polymers should be as short as possible. However, the ashing rate is low in the first step, unnecessarily increasing the processing time.

SUMMARY OF THE INVENTION

The present invention has been contrived on the basis of the aforementioned problems. It is, therefore, an object of the present invention to provide, a method for removing deposits accumulated inside a processing chamber during an etching process in a shortest possible time.

In accordance with an aspect of a preferred embodiment of the present invention, there is provided a plasma processing method for plasma-processing a target object accommodated in a processing chamber, including the steps of: etching the target object with a CF-based processing gas by using a patterned resist film as a mask; removing deposits accumulated inside the processing chamber during the step of etching the target object by using a processing gas containing at least an $O_2$ gas; and ashing the resist film by using a processing gas containing at least an $O_2$ gas, wherein relevant places in the processing chamber from which the deposits are removed are heated in the step of removing the deposits.

In accordance with the processing method, the relevant places in the processing chamber from which the deposits are to be removed are heated, and thus, the deposits accumulated inside the processing chamber during the step of etching the target object can be removed by plasma ashing using the processing gas containing the $O_2$ gas in a short time.

In the processing method, in the step of removing the deposits, the relevant places may be heated to a temperature equal to or higher than 150° C. In case a heating temperature is about, e.g., 180° C., the deposits can be removed at a rate about 3.5 times faster than that of conventionally removing the deposits, e.g., at about 60° C. Further, it is preferable that an upper limit of the heating temperature is about 200° C., when, for example, a performance of a heater unit, an influence of a heat on the processing chamber and the like are taken into consideration.

The relevant places are a part or the whole of places exposed to a plasma having an electron density higher than $1 \times 10^{10}$ cm$^{-3}$ during a plasma processing. Further, the relevant places include, for example, at least a part or the whole of an inner peripheral surface of the processing chamber. Moreover, an electric power may not be applied to the target object during the step of removing the deposits. On the other hand, an electric power equal to or greater than 0.19 W/cm$^2$ may be applied to the target object during the step of ashing the resist film.

Further, in the step of removing the deposits, a density of F in a plasma is measured, and an endpoint of the step of removing the deposits is determined on the basis of a measurement result. In this case, the endpoint may be determined when the density of F in the plasma becomes equal to or less than a threshold value.

Further, in the step of removing the deposits, the density of F may be measured while performing a plasma processing by using a processing gas containing at least the $O_2$ gas and one or more inert gases, on the basis of a ratio [F*]/[inert gas*] on a surface of the target object, [F*] being an emission intensity of F radicals and [inert gas*] being an emission intensity of the one or more inert gases. As mentioned above, by using the ratio [F*]/[inert gas*], an influence of a plasma density generated in the processing chamber or an influence of CF polymers and the like deposited on an optical unit guiding an emission spectrum to an outside of the processing chamber can be removed. Accordingly, the density of F can be measured accurately while performing a plasma processing.

The one or more inert gases may be any one of a He gas, a Ne gas, an Ar gas, a Kr gas, a Xe gas, a Rn gas, or any arbitrary combination thereof. Further, the one or more inert gases may be the Ar gas, and the emission intensity of the F radicals [F*] may be measured at a wavelength of about 703.7 nm, and the emission intensity of the inert gases [inert gas*] may be measured at a wavelength of about 703.0 nm. Further, from the ratio [F*]/[inert gas*], the density of F during the plasma processing may be measured by an actinometry. Further, the emission intensity of the F radicals [F*] and the emission intensity of the inert gases [inert gas*] may be measured at a position located above the target object.

Further, in accordance with another aspect of the preferred embodiment of the present invention, there is provided a plasma processing apparatus for plasma-processing a target object accommodated in a processing chamber, including: a processing gas supply source for selectively supplying a CF-based processing gas and a processing gas containing at least $O_2$ into the processing chamber; a heater unit for heating a part or the whole of places exposed to a plasma having an electron density higher than $1 \times 10^{10}$ $cm^{-3}$ during a plasma processing. In this case, the heater unit may serves to heat a part or the whole of an inner peripheral surface of the processing chamber.

In accordance with the plasma processing apparatus, for example, the inner peripheral surface of the processing chamber is heated, and thus, the deposits accumulated inside the processing chamber when the target object is etched by using the CF-based processing gas can be removed by plasma ashing using the processing gas containing the $O_2$ gas in a short time.

In this plasma processing apparatus, the heating temperature of the heater unit may be equal to or higher than 150° C. As described above, by heating the inner peripheral surface of the processing chamber and the like with the heater unit at about 180° C., the deposits can be removed at a rate about 3.5 times faster than that of conventionally removing the deposits, e.g., at about 60° C.

Further, the processing gas supply source selectively supplies the CF-based processing gas, a processing gas containing at least an $O_2$ gas and one or more inert gases, and the processing gas containing at least $O_2$ into the processing chamber, and the plasma processing apparatus may further include: the optical unit guiding an emission spectrum on a surface of the target object to the outside of the processing chamber; an emission intensity measuring unit for measuring at the outside of the processing chamber an intensity of the emission spectrum on the surface of the target object, guided by the optical unit; and a control unit for measuring, while a plasma processing is performed, a density of F on the basis of a ratio [F*]/[inert gas*] and controlling the plasma processing apparatus on the basis of the density of F, [F*] being an emission intensity of F radicals and [inert gas*] being an emission intensity of the inert gases on the surface of the target object, and [F*] and [inert gas*] being measured by the emission intensity measuring unit. In accordance with this processing apparatus, an influence of a plasma density generated in the processing chamber or an influence of CF polymers and the like deposited on the optical unit guiding the emission spectrum to the outside of the processing chamber can be removed. Accordingly, the density of F can be measured accurately while the plasma processing is performed, and thus, the plasma processing apparatus can be controlled on the basis of the density of F.

In this case, the emission intensity measuring unit may be a polychromator. Further, the optical unit may guide the emission spectrum from above the target object to the outside of the processing chamber. Further, the control unit may measure the density of F during the plasma processing from the ratio [F*]/[inert gas*] by the actinometry.

In accordance with the preferred embodiment of the present invention, the deposits accumulated inside the processing chamber during the etching process can be removed in a shortest possible time.

BRIEF DESCRIPTION OF THE DRAWINGS

The above and other objects and features of the present invention will become apparent from the following description of preferred embodiment given in conjunction with the accompanying drawings, in which.

DETAILED DESCRIPTION OF THE PREFERRED EMBODIMENTS

Figure 1:
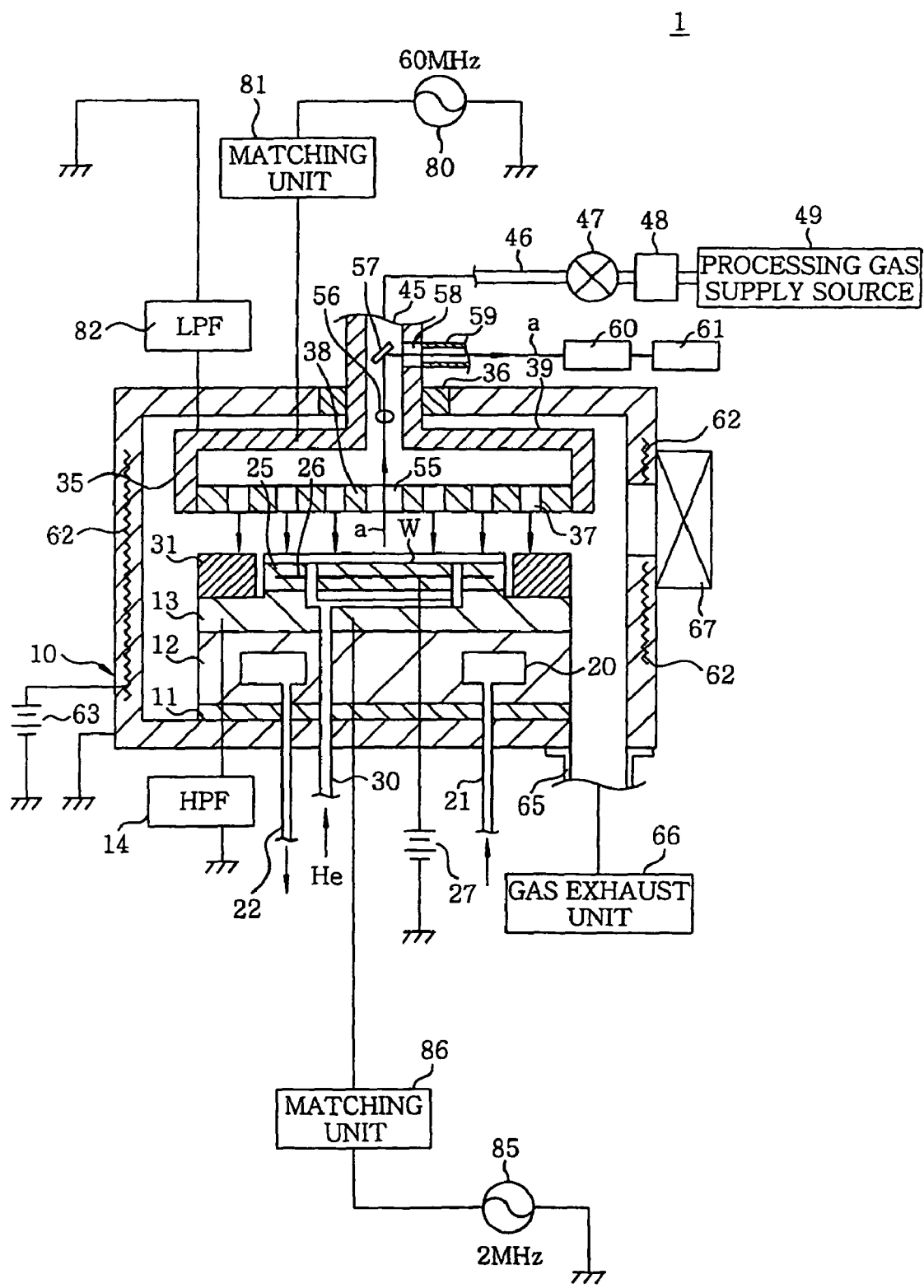
FIG. 1 offers a schematic configuration view of a plasma processing apparatus in accordance with a preferred embodiment of the present invention.

Hereinafter, a preferred embodiment of the present invention will be described in detail with reference to the accompanying drawings. Further, in the present specification and the drawings, components having essentially the same functions are indicated by the same reference numerals, to omit duplicate explanation.

FIG. 1 is a schematic configuration view of a parallel plate type plasma processing apparatus 1 shown as an example of a plasma processing apparatus in accordance with a preferred embodiment of the present invention.

This plasma processing apparatus 1 includes a cylindrically shaped chamber (a processing chamber) 10 made of, for example, aluminum whose surface is anodically oxidized (alumite treated), the chamber being grounded. A generally cylindrical susceptor supporting table 12 is disposed through an insulating plate 11 made of, for example, a ceramic on a bottom portion of the chamber 10 for mounting a semiconductor wafer (hereinafter referred to as a [wafer]) W serving as a target object. A susceptor 13 constituting a lower electrode is provided on the susceptor supporting table 12. A high pass filter (HPT) 14 is connected to the susceptor 13.

A temperature controlling medium container 20 is provided in the susceptor supporting table 12. Further, a temperature controlling medium is introduced into the temperature controlling medium container 20 through an inlet line 21 and circulated, and discharged through a discharge line 22. A temperature of the susceptor 13 can be controlled to a desired temperature by a circulation of the temperature controlling medium.

An upper central portion of the susceptor 13 is formed in a protruded and circular plate shape, and an electrostatic chuck 25 having roughly the same form as the wafer W serving as a target object is provided thereon. The electrostatic chuck 25 has a configuration such that an electrode 26 is disposed between insulating members. A DC voltage of, for example, 1.5 kV is applied to the electrostatic chuck 25 from the DC power supply 27 connected to the electrode 26. Accordingly, the wafer W is electrostatically adsorbed to the electrostatic chuck 25.

Further, a gas passage 30 is formed through the insulating plate 11, the susceptor supporting table 12, the susceptor 13 and electrostatic chuck 25 to supply a heat transfer medium (for example, a backside gas such as a He gas) to a backside of the wafer W serving as a target object. A heat is transferred between the susceptor 13 and the wafer W through the heat transfer medium, allowing the wafer W to be maintained at a predetermined temperature.

On an upper peripheral portion of the susceptor 13, there is provided an annular focus ring 31 to surround the wafer W mounted on the electrostatic chuck 25. This focus ring 31 is made of an insulating material such as ceramics or quartz, or a conductive material. By disposing the focus ring 31 thereon, an etching uniformity is improved.

In addition, an upper electrode 35 is provided above the susceptor 13 facing the susceptor 13 in parallel. The upper electrode 31 is supported inside the chamber 10 via an insulating member 36. Further, the upper electrode 35 includes an electrode plate 38 facing the surface of the susceptor 13 and having a plurality of injection openings 37; and an electrode supporting member 39 supporting the electrode plate 38. The electrode plate 38 is made of an insulating material or a conductive material. In this preferred embodiment, the electrode plate 38 is made of silicon. The electrode supporting member 39 is, for example, made of a conductive material such as aluminum having an alumite-treated surface or the like. Further, a gap between the susceptor 13 and the upper electrode 35 is controllable.

A gas inlet opening 45 is provided at a central portion of the electrode supporting member 39 in the upper electrode 35. A gas supply line 46 is connected to the gas inlet opening 45. Further, a processing gas supply source 49 is connected to the gas supply line 46 via a valve 47 and a mass flow controller 48.

Various processing gases such as an etching gas for an etching and an ashing gas for an ashing are supplied from the processing gas supply source 49 to the inside of the chamber 10 through the injection openings 37. Further, although FIG. 1 shows a single processing gas supply system including the gas supply line 46, the valve 47, the mass flow controller 48, the processing gas supply source 49 and the like, the plasma processing apparatus 1 may have a plurality of processing gas supply systems. Thus, flow rates of the processing gases, e.g., $CF_4$, $C_xO_y$, $O_2$, $N_2$, $N_xO_y$, $NH_3$, $CHF_3$, $H_2$, Ar, He, Xe and the like, may be independently controlled, respectively, and any combination thereof is introduced in the chamber 10.

A transmission window 55 disposed just below the gas inlet opening 45 is formed at a center of the electrode plate 38. This transmission window 55 is made of, e.g., a quartz glass or the like. The transmission window 55 is disposed above a center of the wafer W mounted on the susceptor 13 in the chamber 10. Accordingly, an emission spectrum a on a central surface of the wafer W accommodated in the chamber 10 is incident to an inside of the gas inlet opening 45 through the transmission window 55.

In the gas inlet opening 45, a condensing lens 56 and a prism 57 serving as an optical unit guiding the emission spectrum a incident to the inside of the gas inlet opening 45 through the transmission window 55 to an outside of the chamber 10, are disposed. A transmission window 58 formed at a side surface of the gas inlet opening 45 and made of, e.g., a quartz glass or the like is disposed by the side of the prism 57, and a light guiding passage 59 of an optical fiber or the like is connected to an outer portion of the transmission window 58. The light guiding passage 59 is connected to a polychromator 60 serving as an emission intensity measuring unit for measuring an emission intensity of the emission spectrum a. Accordingly, the emission spectrum a on a surface of the wafer W is incident to the polychromator 60 through the transmission window 55, the condensing lens 56, the prism 57, the transmission window 58 and the light guiding passage 59, and the emission intensity of the emission spectrum a on the wafer W surface is measured by the polychromator 60 disposed at the outside of the chamber 10.

Further, the emission intensity measured by the polychromator 60 is inputted to a control unit 61. As will be described later in detail, the control unit 61 can measure, for example, a density of F during a plasma processing in accordance with the emission intensity thus inputted from the polychromator 60.

A heater unit 62 is built in a circumferential surface of the chamber 10. There is provided a configuration such that the heater unit 62 heats an inner peripheral surface of the chamber 10 cylindrically disposed to surround the wafer W mounted on the susceptor 13. A DC voltage is applied to the heater unit 62 from the DC power supply 63, and the heater unit 62 can heat the inner peripheral surface of the chamber 10 to a temperature equal to or higher than, for example, 150° C.

A gas exhaust line 65 is connected to a bottom portion of the chamber 10, and a gas exhaust unit 66 is connected to the gas exhaust line 65. The gas exhaust unit 66 includes a vacuum pump such as a turbo molecular pump or the like to control a pressure inside the chamber 10 to a predetermined depressurized atmosphere (e.g., equal to or less than 0.67 Pa). Further, a gate valve 67 is provided at a sidewall of the chamber 10. By opening the gate valve 67, the wafer W can be loaded into and unloaded from the chamber 10. Further, a wafer cassette (not shown), for example, is used for transferring the wafer W.

A first high frequency power supply 80 is connected to the upper electrode 35, and a first matching unit 81 is interposed at a feeder line thereof. Further, a low pass filter (LPF) 82 is connected to the upper electrode 35. The first high frequency power supply 80 can output an electric power having a frequency of 40 to 150 MHz. By applying an electric power having such a high frequency to the upper electrode 35, a high-density plasma in a desirably dissociated state can be formed in the chamber 10, thereby enabling a plasma processing to be performed under a lower pressure condition than a conventional pressure condition. The frequency of the output power from the first high frequency power supply 80 preferably ranges from 40 to 80 MHz. Typically, a frequency of around 60 MHz, as shown, is used.

A second high frequency power supply 85 is connected to the susceptor 13 serving as the lower electrode, and a second matching unit 86 is interposed at a feeder line thereof. The second high frequency power supply 85 can output an electric power having a frequency ranging from several hundreds kHz to less than several tens MHz. By applying an electric power having such a frequency to the susceptor 13, it is possible to facilitate a proper ion action on the wafer W serving as a target object without inflicting damages thereon. The frequency of the output power from the second high frequency power supply 85 is typically chosen to be 2 MHz as shown, 3.2 MHz, 13.56 MHz or the like. In the present preferred embodiment, the frequency thereof is chosen to be 2 MHz.

The control unit 61 controls all of the operations of the plasma processing apparatus 1 configured as described above. The control unit 61 controls, for example, a supply of the various processing gases to the chamber 10 by the processing gas supplying source 49, a power supply to the upper electrode 35, a power supply to the susceptor 13 (the lower electrode), a heating by the heater unit 62 or the heating temperature, the depressurized atmosphere inside the chamber 10 by the gas exhaust unit 66, an opening/closing of the gate valve 67, an electrostatic adsorption of the wafer W by the electrostatic chuck 25, a temperature of the wafer W by a supply of the heat transfer medium through the gas passage 30, a temperature of the susceptor 13 by a circulation of the temperature controlling medium to the temperature controlling medium container 20, and the like.

Figure 2:
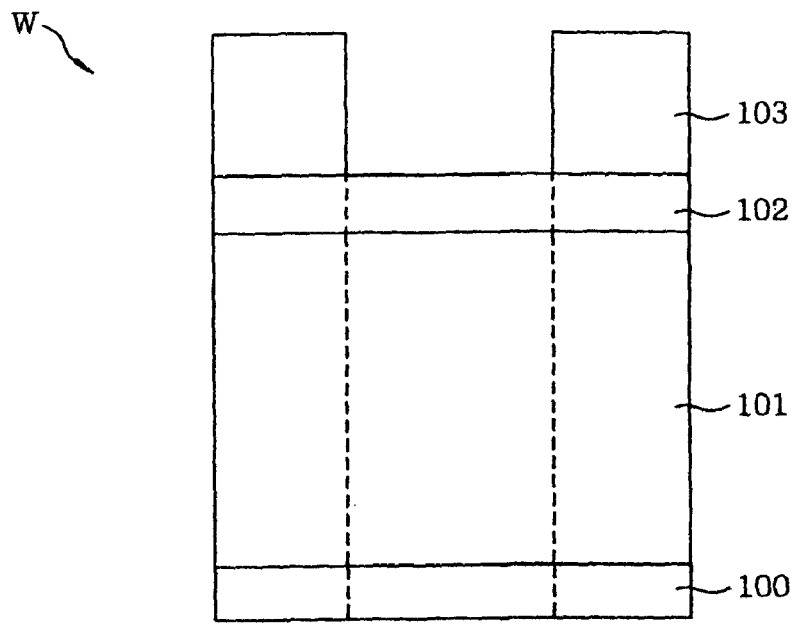
FIG. 2 shows a schematic cross sectional view showing a film configuration of a target object on which an etching process and an ashing process are performed by the plasma processing apparatus shown in FIG. 1.

Next, FIG. 2 is a drawing illustrating the wafer W serving as a target object on which an etching process and an ashing process are performed by the plasma processing apparatus 1 shown in FIG. 1.

The wafer W illustrated in FIG. 2 includes sequentially laminated layers of an etching stop layer 100, a film of a low dielectric constant (hereinafter, referred to as a [Low-k film]) 101, an antireflection film (BARC: Bottom Anti-Reflective Coat) 102, and a photoresist film 103. Further, although it is not shown in FIG. 2, for example, a metal layer such as a Cu (copper) wiring layer or the like, various semiconductor layers, and a silicon substrate may exist under the etching stop layer 100.

A resist material forming the photoresist film 103 is of a type sensitized to, e.g., a KrF light (a wavelength of 248 nm), and a film thickness thereof is, e.g., about 400 nm. Further, a circular hole having a diameter of, e.g., 200 nm has been previously patterned using a photolithography process.

The antireflection film 102 serves to suppress a reflection light from the under layer when the photoresist film 103 is exposed to the KrF light. Accordingly, a finer patterning can be carried out. Further, the film thickness of the antireflection film 102 is, e.g., about 60 nm.

A low dielectric constant material forming the Low-k film 101 may include siloxane-based (Si—O—Si) HSQ (Hydrogen-SilsesQuioxane), MSQ (Methyl-hydrogen-SilsesQuioxane) or the like. Further, an organic material can be employed other than the siloxane-based material. In the present preferred embodiment, Black Diamond (registered trademark) or Coral (registered trademark) as MSQ is employed as the material forming the Low-k film 101. Further, the film thickness of the Low-k film 101 is, e.g., about 1000 nm.

The etching stop layer 100 is made of, e.g., a SiC material, and the film thickness thereof is, e.g., about 80 μm. When the Low-k film 101 is etched by using the photoresist film 103 serving as a mask, layers (e.g., a metal layer) located below the etching stop layer 100 are not affected by the etching process due to the etching stop layer 100.

Hereinafter, a plasma etching process and a plasma ashing process on the wafer W 200 illustrated in FIG. 2 using the plasma processing apparatus 1 will be explained.

First, the antireflection film 102 is etched by using the patterned photoresist film 103 as a mask (a first etching process). Process conditions when the first etching process is performed are such that, for example, the pressure in the chamber 10 is controlled to 50 mTorr, the high frequency power applied to the upper electrode 35 is 1000 W, and the high frequency power applied to the susceptor 13 is 100 W. Further, $CF_4$ is used as a processing gas. The control unit 61 controls the process conditions.

Next, the Low-k film 101 is etched by using the patterned photoresist film 103 as a mask (a second etching process). Process conditions when the second etching process is performed are such that, for example, the pressure in the chamber 10 is controlled to 50 mTorr, the high frequency power applied to the upper electrode 35 is 1200 W, and the high frequency power applied to the susceptor 13 is 1700 W. Further, a gaseous mixture of $CHF_3$, $CF_4$, Ar, $N_2$ and $O_2$ is used as a processing gas. The control unit 61 controls the process conditions.

Thereafter, the so-called over-etching process (a third etching process) may be carried out to prevent Low-k material from remaining on a bottom portion of via holes formed on the Low-k film 101 during the second etching process. The process conditions in the third etching process may be described, for example, as follows: The pressure in the chamber 10 is controlled to be 75 mTorr; a high frequency power of 1200 W is applied to the upper electrode 35 and the susceptor 13; and a gaseous mixture of $C_4F_8$, Ar and $N_2$ is used as a processing gas. The control unit 61 controls the process conditions.

By performing the aforementioned first to third etching processes, the via holes are formed on the Low-k film 101.

Herein, the heating of the inner peripheral surface of the chamber 10 by the heater unit 62 may or may not be performed in the first to third etching processes. The control unit 61 also controls the heating performed by the heater unit 62. In the first to third etching processes, CF polymers (a fluorocarbon-based polymer) formed as a result of F (fluorine) and C (carbon) reacting are adhered and gradually deposited on the inner peripheral surface of the chamber 10. However, the higher the temperature is, the more difficult for CF polymers to adhere thereto. Accordingly, if the heating temperature of the heater unit 62 is equal to or higher than, for example, 150° C., an adhesion of the CF polymers on the inner peripheral surface of the chamber 10 can be suppressed in the first to third etching processes.

Thereafter, the plasma ashing process is performed on the wafer W to remove the photoresist film 103 in the same chamber 10.

However, as described above, as the first to third plasma etching processes are performed on the wafer W, the CF polymers may become adhered on the inner peripheral surface of the chamber 10 or the like and gradually be deposited. In a state such that the CF polymers are deposited on the inner peripheral surface of the chamber 10 or the like, if the plasma ashing process is directly carried out to remove only the photoresist film 103, the CF polymers deposited on the inner peripheral surface of the chamber 10 may become redissociated, and, for example, the Low-k film 101 or the etching stop layer 100 may be etched by F, inflicting damages.

Therefore, the plasma process in accordance with this preferred embodiment is respectively divided into a first ashing process for removing the CF polymers deposited on the inner peripheral surface of the chamber 10 and a second ashing process for removing the photoresist film 103 by ashing. First of all, by performing the first ashing process, the CF polymers deposited on the inner peripheral surface of the chamber 10 are removed without affecting the wafer W. Further, the photoresist film 103 is removed by performing the second ashing process after the CF polymers are removed.

Herein, the process conditions applied to the first ashing process, for example, are: a pressure of 20 mTorr in the chamber 10; a gap of 40 mm between the upper electrode 35 and the susceptor 13; a high frequency power of 500 W applied to the upper electrode 35; and a high frequency power of 0 W applied to the susceptor 13 (i.e., the so-called zero bias state wherein a high frequency power is not applied to the susceptor 13). By using the zero bias state, F is prevented from being pulled to the wafer W without inflicting damages thereon. Further, a processing gas (a first processing gas) containing at least the $O_2$ gas and one or more inert gases, for example, a gaseous mixture of Ar (inert gas) and $O_2$, having a Ar/$O_2$ flow rate ratio (a gas flow rate of Ar/a gas flow rate of $O_2$) of, for example, 450 sccm/50 sccm is used. The process conditions are controlled by the control unit 61.

Further, in the first ashing process, the inner peripheral surface of the chamber 10 is heated to a temperature equal to or higher than, for example, 150° C. by the heater unit 62. The heating by the heater unit 62 is also controlled by the control unit 61.

Figure 3:
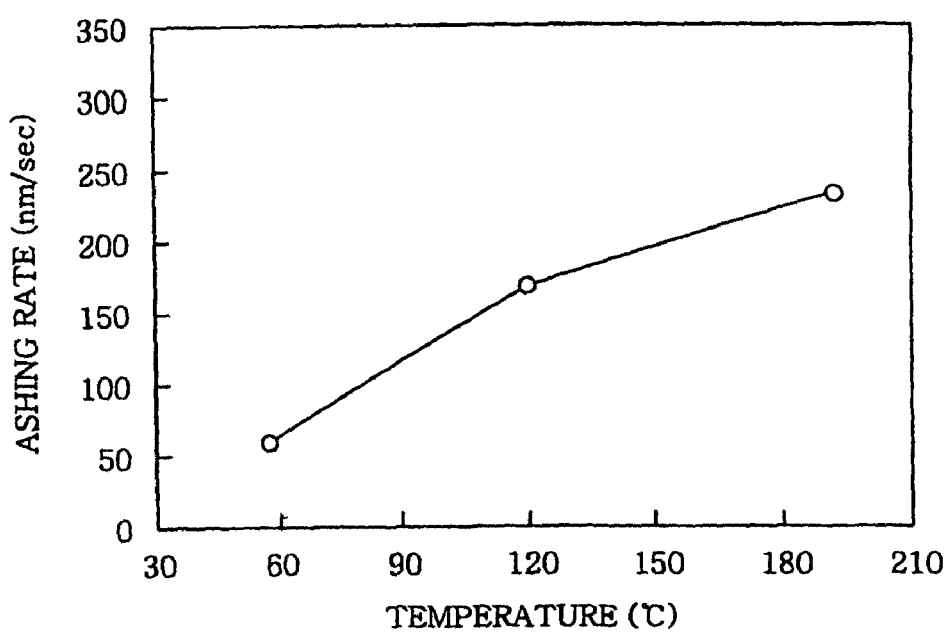
FIG. 3 is a graph for explaining a relationship between a temperature and an ashing rate of CF polymers.

Herein, FIG. 3 is a graph for explaining a relationship between a temperature of the inner peripheral surface of the chamber 10 and an ashing rate of removing the CF polymers deposited on the inner peripheral surface of the chamber 10. As understood from FIG. 3, the ashing rate is proportional to the temperature, and the higher the temperature, the faster will be the rate of removing the CF polymers deposited on the inner peripheral surface of the chamber 10. Therefore, in the first ashing process, by heating the inner peripheral surface of the chamber 10 by the heater unit 62, the ashing rate is increased. Accordingly, the CF polymers are removed from the inner peripheral surface of the chamber 10 in a shortest possible time, entailing a reduction of a processing time.

In this case, the heating temperature of the heater unit 62 is preferably equal to or higher than 150° C. In accordance with an assumption derived from the Arenius relationship, by heating, for example, the inner peripheral surface of the chamber 10 at about 180° C. by the heater unit 62, the CF polymers can be removed at a rate about 3.5 times faster than that of conventionally removing the CF polymers, e.g., at about 60° C. The heating temperature of heater unit 62 is also controlled by the control unit 61.

Further, the heating temperature of heater unit 62 is properly set by the control unit 61 by considering the rate of removing the CF polymers, and an influence of a heat on the chamber 10 and the other components. In this case, it is preferable that an upper limit of the heating temperature is about 200° C., when, for example, a performance of the heater unit 62, the influence of the heat on the chamber 10 and the like are taken into consideration.

Meanwhile, the density of F in the plasma is measured in the chamber 10 during the first ashing process, and an endpoint of the first ashing process is determined on the basis of the measured density of F. In this case, in the first ashing process, if the measured density of F in the plasma becomes equal to or less than, for example, a predetermined threshold value, the endpoint of the first ashing process may be determined.

Figure 4:
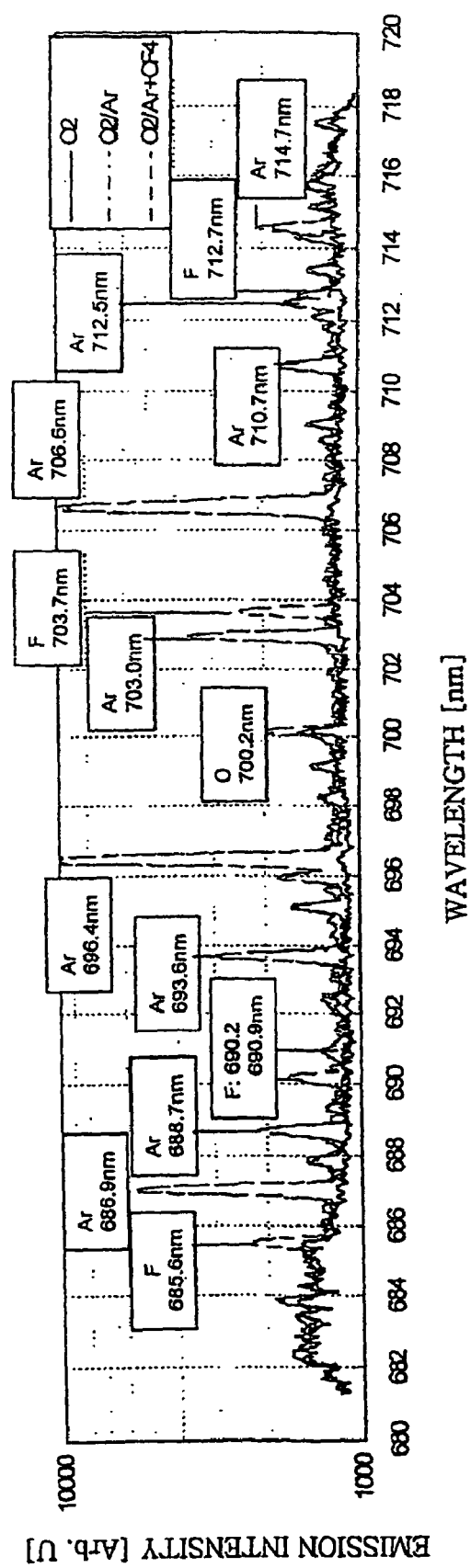
FIG. 4 is a graph for explaining a relationship between an emission intensity of an emission spectrum on a surface of the target object measured by a polychromator and a wavelength.

Herein, the density of F in the plasma in the chamber 10 is measured as follows. That is, in the plasma processing apparatus 1, the emission spectrum a on the central surface of the wafer W mounted on the susceptor 13 in the chamber 10 is incident to the polychromator 60 through the transmission window 55 disposed on an upper side thereof, the condensing lens 56, the prism 57, the transmission window 58 and the light guiding passage 59, and the emission intensity of the emission spectrum a on the wafer W surface is measured by the polychromator 60 disposed at the outside of the chamber 10. In this case, in the polychromator 60, a light is dispersed into its spectrum, and an intensity is measured at a wavelength of about 703.7 nm from the emission spectrum a, and thus, the emission intensity of F radicals [F*] on the surface of the wafer W can be measured. Further, a light is dispersed into its spectrum, and an intensity is measured at a wavelength of about 703.0 nm from the emission spectrum a, and thus, the emission intensity of an Ar gas [inert gas*] on the surface of the wafer W can be measured. Herein, FIG. 4 is a graph for explaining a relationship between the emission intensity of the emission spectrum a on the surface of the wafer W measured by the polychromator and the wavelength. As understood from FIG. 4, the emission intensity of an Ar gas [inert gas*] shows a peak at a wavelength of 703.0 nm, and the emission intensity of the F radicals [F*] shows a peak at a wavelength of 703.7 nm. Because the two peaks are located at frequencies close to each other, in case using the polychromator 60 (a high resolution CCD) having a narrow frequency range, the emission intensity of the Ar gas [inert gas*] and the emission intensity of the F radicals [F*] can be measured for each peak accurately.

Further, [F] being the emission intensity of the F radicals and [inert gas*] being the emission intensity of the Ar gas on the surface of the wafer W, [F*] and [inert gas*], measured by the polychromator 60, are inputted to the control unit 61. The control unit 61 measures the density of F during the plasma processing on the basis of the ratio [F*]/[inert gas*] thus inputted from the polychromator 60 by an actinometry in accordance with the following equation 1:

Density of $F[cm^{-3}] = A \times (N \times P[Torr])/(760 \times 224000 [cm^3]) \times (Q_{Ar}/Q) \times ([F^*]/[\text{inert gas}^*])$, wherein [equation 1]

A: actinometric scaling factor
N: Avogadro's number
P: pressure in the chamber 10
$Q_{Ar}$: flow rate of Ar supplied into the chamber 10
Q: total flow rate of a processing gas supplied into the chamber 10

Figure 5:
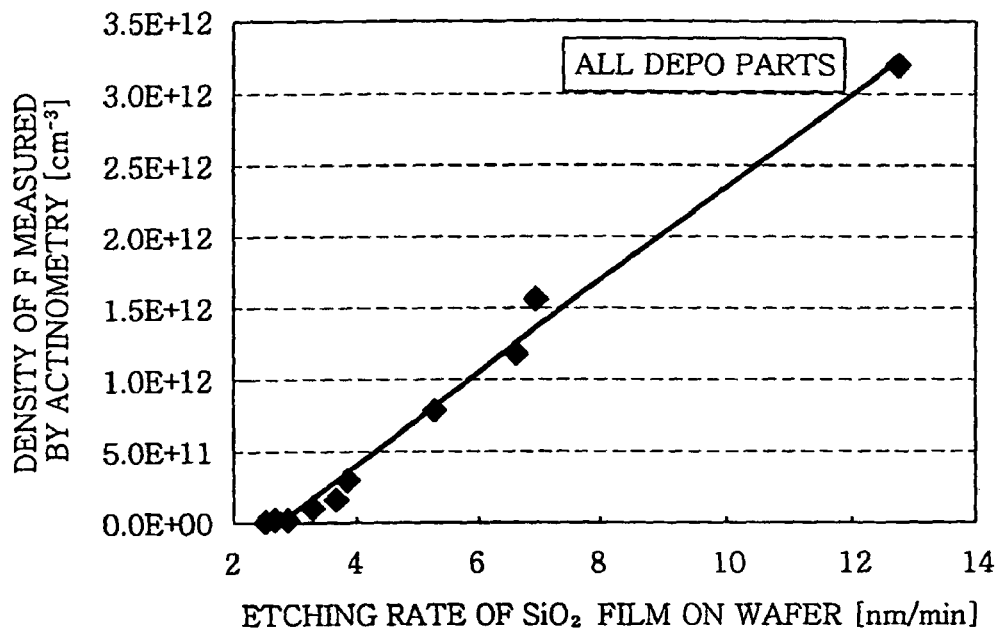
FIG. 5 is a graph for explaining a relationship between a density of F measured by an actinometry and an etching rate on a wafer surface while a plasma processing is performed.

Meanwhile, when the first ashing process is performed as described above, the CF polymers deposited in the chamber 10 are gradually removed, and thus, the density of F in the plasma in the chamber 10 tends to decrease gradually. Herein, FIG. 5 is a graph for explaining a relationship between the density of F measured by the actinometry while performing the plasma processing and an etching rate on the wafer W surface. The graph in FIG. 5 was obtained by accommodating a wafer W having a $SiO_2$ film formed on the surface thereof in each of the chambers 10 in which CF polymer deposition states (deposition amounts) on in-chamber 10 members (including an inner wall of the chamber 10) are different, respectively, and then, performing an ashing process. As understood from FIG. 5, the density of F measured by the actinometry is approximately proportional to the etching rate of the $SiO_2$ film. Therefore, if the density of F decreases, damages to the surface of the wafer W are reduced. Accordingly, when the density of F is reduced to such a state that the damages to the wafer W are not considered significant, the first ashing process may be completed.

Herein, in case a predetermined threshold value of, for example, the density of F is set, and then, the density of F measured by the actinometry becomes equal to or less than the threshold value in the control unit 61, the endpoint of the first ashing process can be determined. Further, preferably, the state that the damages to the wafer W are not considered significant can be determined by the threshold value set as described above. Accordingly, the threshold value can be properly set by considering various factors such as a kind of a wafer W, a kind of a film, a kind of a process, and the like.

As mentioned above, [F*] being the emission intensity of the F radicals and [inert gas*] being the emission intensity of the Ar gas, by measuring the density of F during the plasma processing on the basis of the ratio [F*]/[inert gas*], an influence of a plasma density generated in the chamber 10 or influences of a contamination of the transmission window 55 guiding the emission spectrum a to the outside of the chamber 10 and the like can be removed. That is, although, for example, the gaseous mixture of the Ar gas (inert gas) and the $O_2$ gas is used as a processing gas in the first ashing process, the Ar gas is not affected by the plasma density generated in the chamber 10. Therefore, by measuring the density of F during the plasma processing on the basis of the ratio [F*]/[inert gas*] to the emission intensity of the Ar gas [inert gas*], the influence of a plasma density can be removed from the measurement of the density of F. Further, in case the transmission window 55 is made dirty by, for example, the CF polymers or the like, both the emission intensity of the F radicals [F*] and the emission intensity of the Ar gas [inert gas*] are equally affected by the contamination. Accordingly, by taking the ratio of the two, the influence of the contamination can be removed from the measurement of the density of F. As a result, the density of F can be measured accurately while the plasma processing is performed, and the endpoint of the first ashing process can be accurately determined.

Further, after thus detecting the endpoint on the basis of the density of F, the first ashing process is completed. After that, the resist film 103 is removed in the following second ashing process.

Herein, process conditions applied to the second ashing process, for example, are described as follows: a pressure of 10 mTorr in the chamber 10; a gap of 55 mm between the upper electrode 35 and the susceptor 13; a high frequency power of 500 W applied to the upper electrode 35; and a high frequency power of 200 W applied to the susceptor. Further, a gaseous mixture of $N_2$ (a second non-reactive gas) and $O_2$, having a $N_2/O_2$ flow rate ratio (a gas flow rate of $N_2$/a gas flow rate of $O_2$) of 60 sccm/60 sccm is used as a processing gas (a second processing gas). Further, each pressure of a cooling gas on a backside of a center portion and an edge portion of the wafer W is 10 Torr and 35 Torr, respectively. Further, each set temperature of the upper electrode, the lower electrode and a sidewall in the chamber 10 is adjusted to 60° C., 50° C. and 20° C., respectively. Further, a second ashing processing time is 26 seconds. Further, the heating by the heater unit 62 built in the inner peripheral surface of the chamber 10 is not particularly required in the second ashing process. The control unit 61 controls the process conditions.

In addition, during transition periods from the first through third etching processes and the first and the second ashing processes, the first and the second high frequency power supplies 80 and 85 for supplying the high frequency power to the upper electrode 35 and the susceptor 13, respectively, are turned off. Meanwhile, the pressure in the chamber 12, which is set to be 10 mTorr, during the second ashing process is too low to ignite a plasma in the chamber 10 in a stable manner. Therefore, a plasma ignition process is performed for three seconds between the first and the second ashing processes, requiring the pressure in the chamber 10 to temporarily increase up to, e.g., 30 mTorr. By performing such plasma ignition process, it is possible to ignite the plasma securely and then lower the pressure in the chamber 10 for the following second ashing process.

Accordingly, in the second ashing process, the photoresist film 103 is removed so that the Low-k film 101 or the etching stop layer 100 is not damaged by the F radicals while maintaining a high film quality.

Although a preferred embodiment of the present invention has been described in detail hereinabove, the present invention is not limited thereto, and various changes and modifications may be made. For example, the CF polymers deposited during the first through third etching processes are removed from the inner peripheral surface of the chamber 10 in the illustrated preferred embodiment, but the CF polymers are also deposited on different places in the chamber 10. Therefore, by also heating the places other than the inner peripheral surface of the chamber 10 by the heater unit 62 similarly, the rate of removing the CF polymers is increased during the first ashing process, entailing a reduction of a processing time.

Figure 6:
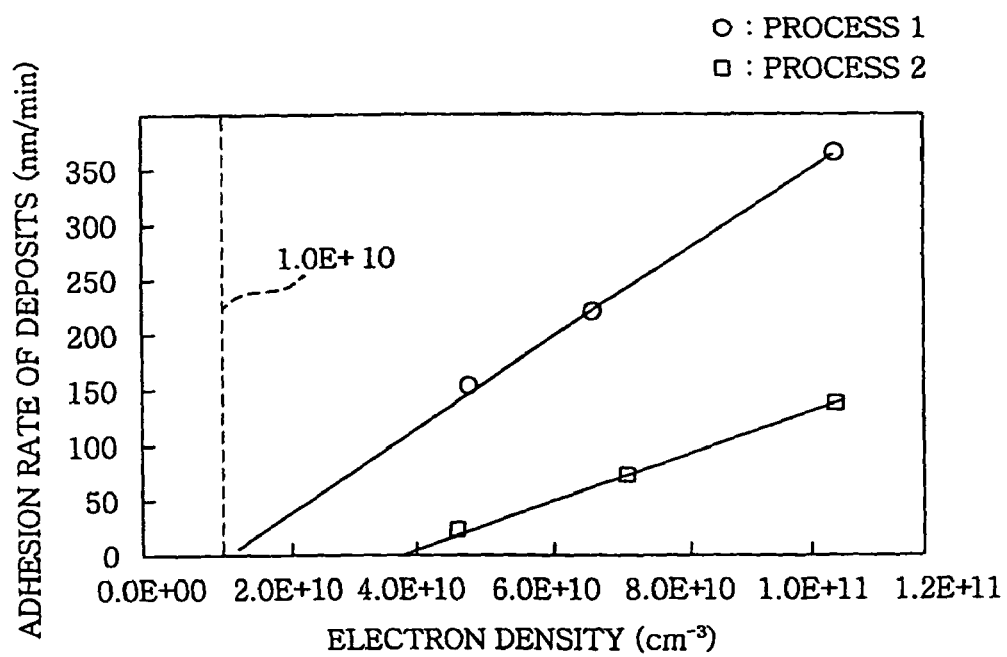
FIG. 6 is a graph for explaining a relationship between an electron density in a plasma and an adhesion rate of deposits (CF polymers) in case of performing an etching by processes 1 and 2.

Further, the deposits will be more easily adhered in the chamber 10 during the plasma processing, the higher the plasma density is. In this case, the deposits such as the CF polymers and the like are adhered to places exposed to a plasma having an electron density higher than $1 \times 10^{10}$ cm$^{-3}$ during the plasma processing, while the adhesion of the deposits to places exposed to a plasma having an electron density less than $1 \times 10^{10}$ cm$^{-3}$ is not considered significant. Herein, FIG. 6 is a graph for explaining a relationship between the electron density in the plasma and an adhesion rate of deposits (CF polymers) in case of performing etching processes by a process 1 wherein the pressure in the chamber 10 is adjusted to 30 mTorr, and a gaseous mixture of $C_4F_6/C_4F_8/Ar/O_2$ (30/15/450/50 sccm) is used as a processing gas, and a process 2 wherein the pressure in the chamber 10 is adjusted to 50 mTorr, and a gaseous mixture of $C_4F_8/Ar/N_2$ (6/1000/150 sccm) is used as a processing gas. As understood from FIG. 6, in case the inside of the chamber 10 is exposed to the plasma having the electron density less than $1 \times 10^{10}$ cm$^{-3}$, the CF polymers are substantially deposited in neither the process 1 nor the process 2. Therefore, in the chamber 10, by heating the places exposed to the plasma having the electron density higher than $1 \times 10^{10}$ cm$^{-3}$ during the plasma processing by the heater unit, the rate of removing the CF polymers is increased during the first ashing process, entailing the reduction of the processing time. Further, in the chamber 10, inner top and bottom surfaces of the chamber 10, the susceptor supporting table 12, an outer peripheral surface of the susceptor 13, a top surface of the focus ring 31 and inner peripheral surface of the gas exhaust line 65 other than the inner peripheral surface of the chamber 10, are considered as the places exposed to the plasma having the electron density higher than $1 \times 10^{10}$ cm$^{-3}$ during the plasma processing. A heater unit can be properly prepared to heat the places.

Further, the heating by the heater unit may or may not be performed in the etching process performed before the step of removing the deposits. In the etching process, in case the heating temperature of the heater unit is equal to or higher than, for example, 150° C., it is possible to suppress the adhesion of the CF polymers to the inner peripheral surface of the chamber 10. Further, the heating by the heater unit may or may not be performed in the ashing process of the resist film performed after the step of removing the deposits.

Further, although the endpoint is detected from the measurement result of the density of F in the plasma in the steps of removing the deposits of the illustrated preferred embodiment, the endpoint of the step of removing the deposits may be determined by, for example, the time. Further, as illustrated in the preferred embodiment, [F*] being the emission intensity of the F radicals and [inert gas*] being the emission intensity of the inert gases, by using the ratio [F*]/[inert gas*], the density of F can be measured accurately while performing the plasma processing, and the endpoint of the step of removing the deposits can be accurately detected.

Besides, in case using the one or more inert gases in the step of removing the deposits, He gas, Ne gas, Kr gas, Xe gas, Rn gas may be used other than the Ar gas. Further, any arbitrary combination thereof, including the Ar gas may be used. Further, the emission intensity of the F radical [F*] may be measured at any wavelength other than 703.7 nm, and the emission intensity of the inert gases [inert gas*] may be measured at any wavelength other than 703.0 nm. Further, although the emission intensity of the F radicals [F*] and the emission intensity of the inert gases [inert gas*] are measured at a position located above the wafer W in the preferred embodiment, their emission intensity may be measured at a position located on the side of the wafer W. Further, the present invention can be applied to plasma processing of other target objects than the wafer W.

While the invention has been shown and described with respect to the preferred embodiment, it will be understood by those skilled in the art that various changes and modifications may be made without departing from the scope of the invention as defined in the following claims.

What is claimed is:

1. A plasma processing method for plasma-processing a target object accommodated in a processing chamber, comprising the sequential steps of:
    etching the target object with a CF-based processing gas by using a patterned resist film as a mask;
    removing deposits accumulated inside the processing chamber during the step of etching the target object by using a first processing gas containing at least an $O_2$ gas;
    igniting a plasma of a second processing gas containing at least an $O_2$ gas;
    lowering a pressure in the processing chamber; and
    ashing the resist film by using the plasma of the second processing gas,
    wherein relevant places in the processing chamber from which the deposits are removed are heated in the step of removing the deposits,
    wherein the pressure in the processing chamber during the step of igniting the plasma is higher than that during the step of removing the deposits, and the pressure in the processing chamber during the step of removing the deposits is higher than that during the step of ashing the resist film, and
    in the step of removing the deposits, the relevant places are heated to a temperature equal to or higher than 150° C.

2. The plasma processing method of claim 1, wherein the relevant places are a part or the whole of places exposed to a plasma having an electron density higher than $1 \times 10^{10}$ cm$^{-3}$ during a plasma processing carried out in the step of etching the target object.

3. The plasma processing method of claim 2, wherein the relevant places include at least a part or the whole of an inner peripheral surface of the processing chamber.

4. The plasma processing method of claim 1, wherein an electric power is not applied to the target object during the step of removing the deposits.

5. The plasma processing method of claim 1, wherein an electric power equal to or greater than 0.19 W/cm$^2$ is applied to the target object during the step of ashing the resist film.

6. The plasma processing method of claim 1, wherein, in the step of removing the deposits, a density of F in a plasma is measured, and an endpoint of the step of removing the deposits is determined on the basis of a measurement result.

7. The plasma processing method of claim 6, wherein the endpoint is determined when the density of F in the plasma becomes equal to or less than a threshold value.

8. The plasma processing method of claim 6, wherein, in the step of removing the deposits, the density of F is measured while performing a plasma processing by using the first processing gas further containing one or more inert gases, on the basis of a ratio [F*]/[inert gas*] on a surface of the target object, [F*] being an emission intensity of F radicals and [inert gas*] being an emission intensity of the one or more inert gases.

9. The plasma processing method of claim 8, wherein the one or more inert gases are any one of a He gas, a Ne gas, an Ar gas, a Kr gas, a Xe gas, a Rn gas, or any arbitrary combination thereof.

10. The plasma processing method of claim 8, wherein the one or more inert gases are the Ar gas, and the emission intensity of the F radicals [F*] is measured at a wavelength of about 703.7 nm, and the emission intensity of the inert gases [inert gas*] is measured at a wavelength of about 703.0 nm.

11. The plasma processing method of claim 8, wherein, from the ratio [F*]/[inert gas*], the density of F during the plasma processing is measured by an actinometry.

12. The plasma processing method of claim 8, wherein the emission intensity of the F radicals [F*] and the emission intensity of the inert gases [inert gas*] are measured at a position located above the target object.

* * * * *